(12) United States Patent
Huang

(10) Patent No.: US 6,890,459 B2
(45) Date of Patent: *May 10, 2005

(54) METHOD FOR MANUFACTURING SEMICONDUCTOR LASER PACKAGE

(75) Inventor: Nan Tsung Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 382 days.

This patent is subject to a terminal disclaimer.

(21) Appl. No.: 10/175,992

(22) Filed: Jun. 19, 2002

(65) Prior Publication Data

US 2003/0197292 A1 Oct. 23, 2003

(30) Foreign Application Priority Data

Apr. 18, 2002 (TW) .................................... 91107987 A

(51) Int. Cl.⁷ ............................................... B29D 11/00
(52) U.S. Cl. .................... 264/1.7; 257/434; 264/272.17; 264/274; 359/811
(58) Field of Search ...................... 264/1.1, 1.7, 272.17, 264/274; 359/811, 900; 257/433, 434; 425/808

(56) References Cited

U.S. PATENT DOCUMENTS

| | | | | |
|---|---|---|---|---|
| 4,217,683 A | * | 8/1980 | Cardinal | 445/44 |
| 5,838,703 A | * | 11/1998 | Lebby et al. | 372/43 |
| 5,939,773 A | * | 8/1999 | Jiang et al. | 257/666 |
| 6,614,602 B1 | * | 9/2003 | Huang | 359/811 |

* cited by examiner

*Primary Examiner*—Mathieu D. Vargot
(74) *Attorney, Agent, or Firm*—Wei Te Chung

(57) ABSTRACT

A method for manufacturing a semiconductor laser package in accordance with a preferred embodiment of the present invention includes the following steps: providing a housing (20) with a top portion (21), the top portion defining an optical cavity (23) composed of a window (231) and a sprue (232); disposing the housing in a cavity of a mold (not shown); closing the mold and injecting a melted transparent plastic resin into the sprue to fill the sprue and the window, thereby forming an integrated optical element; and taking the package out of the mold after curing of the injected plastic resin. The optical element is integrated with the housing, permitting light to pass therethrough. The package has a strong structure and is not as easily damaged when subjected to impacts. The optical element is made of a plastic material which is comparatively inexpensive. Therefore, the manufacturing cost is further reduced.

10 Claims, 5 Drawing Sheets

METHOD FOR MANUFACTURING SEMICONDUCTOR LASER PACKAGE

BACKGROUND OF THE INVENTION

1. Field of the Invention

The present invention relates to semiconductor laser packages, and especially to a method of manufacturing an integrally formed semiconductor laser package.

2. Related Art

Since the development of laser diodes, many applications for their use have been developed. Increasingly, laser diodes are employed for communications and typically are integral to optical disc recording and storage systems. However, laser diodes are fragile and undue mechanical impact and humidity will affect their performance in various ranges of the optical spectrum. To protect laser diodes from damage, semiconductor laser packages have been developed.

Conventional semiconductor laser packages are used with a base, the package engaging with the base to protect laser diodes fixed on the base. The package is generally in the shape of a "can" and is made of a metal material, and has a window made of optical glass attached in a top portion of the package to permit passage of laser emissions therethrough.

A conventional semiconductor laser package is disclosed in the US. Pat. No. 5,052,009. Referring now to FIG. 7, the laser device disclosed in the patent is shown. The laser device 10 includes a base 11, a housing 13 engaging with the base 11 and laser diodes 14,15 inside the housing 13. The laser diodes 14,15 are fixed on the base 11. A glass plate 16 is attached to an opening in the housing 13 by adhesive resin to form a window 12 on a top portion of the housing 13. However, extra procedures are needed to heat and bake the adhesive resin and to achieve optimal characteristics of the glass plate, which is very troublesome and labor consuming. In addition, the adhesive resin is subject to flowing during the manufacture, which can contaminate the glass plate and affect the transparency of the glass plate. Moreover, the adhesive resin is susceptible to degradation when the window is subjected to mechanical impact or high temperatures. This degrades the adhesion between the glass plate and the housing.

Accordingly, it is highly desirable and an object of this invention to provide a method of manufacturing a semiconductor laser package that overcomes the above-mentioned shortcomings. Copending applications Ser. Nos. 10/142,448 filed May 9, 2002, 10/150,359 filed May 16, 2002 (now U.S. Pat. No. 6.614.602 BI), 10/152,409 filed May 20, 2002, and 10/165,743 filed Jun. 6, 2002, with the same applicant and the same assignee as the present application, disclose some approaches.

An object of the present invention is to provide a method of manufacturing a low cost semiconductor laser package that is suitable for large scale manufacture.

SUMMARY OF THE INVENTION

Another object of the present invention is to provide a method of manufacturing a semiconductor laser package which has a strong structure.

To achieve the above-mentioned objects, a method of manufacturing a semiconductor laser package in accordance with a preferred embodiment of the present invention comprises the steps of: (1) providing a housing with a top portion, an optical cavity being defined in the top portion, the optical cavity comprising a window and a sprue in communication with each other; (2) disposing the housing in a cavity of a mold; (3) closing the mold and injecting a melted transparent plastic resin into the sprue to fill the sprue and the window, thereby forming an integrated optical element; (4) taking the package out of the mold after curing of the injected plastic resin.

Other objects, advantages and novel features of the present invention will be drawn from the following detailed description of preferred embodiments of the present invention.

DETAILED DESCRIPTION OF THE INVENTION

Figure 1:
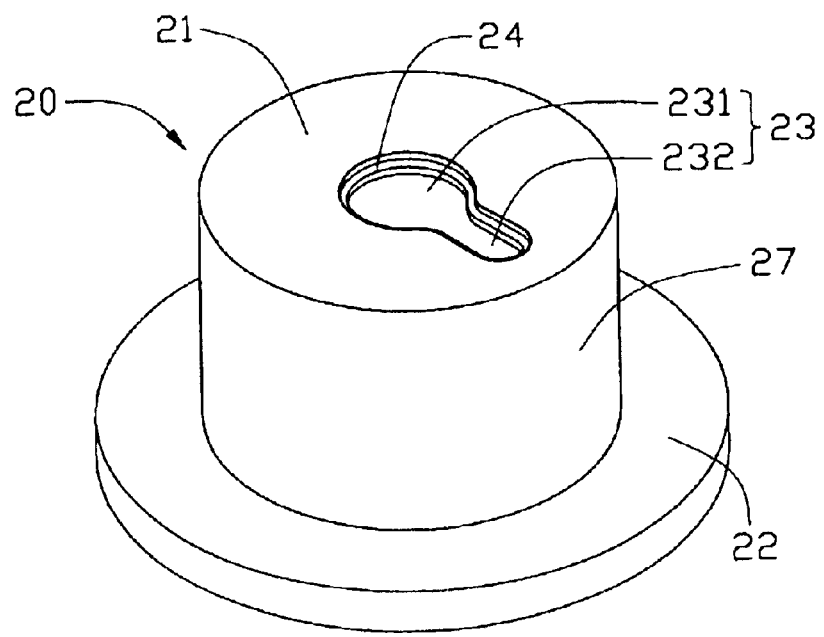
FIG. 1 is a perspective view of a housing of a semiconductor package made according to a method of the present invention.

Referring to FIG. 1, a housing 20 of a semiconductor laser package 40 (best seen in FIG. 5) made by a method in accordance with a preferred embodiment of the present invention is for encapsulating laser diodes. The housing 20 comprises a top portion 21, a bottom portion 27 connected therewith, and an annular base 22. The housing 20 is formed integrally and in the shape of a "can". An optical cavity 23 for receiving an optical element therein is defined in the top portion 21. The optical cavity 23 defines a window 231 and a sprue 232, the window 231 being in communication with the sprue 232. The annular base 22 extends outwardly from a lower periphery of the bottom portion 27 of the housing 20. The annular base 22 is used to engage with a base (not shown) accommodating laser diodes secured thereon. The housing 20 is made of metal by way of stamping, or is made of plastic material by way of press molding.

Figure 2:
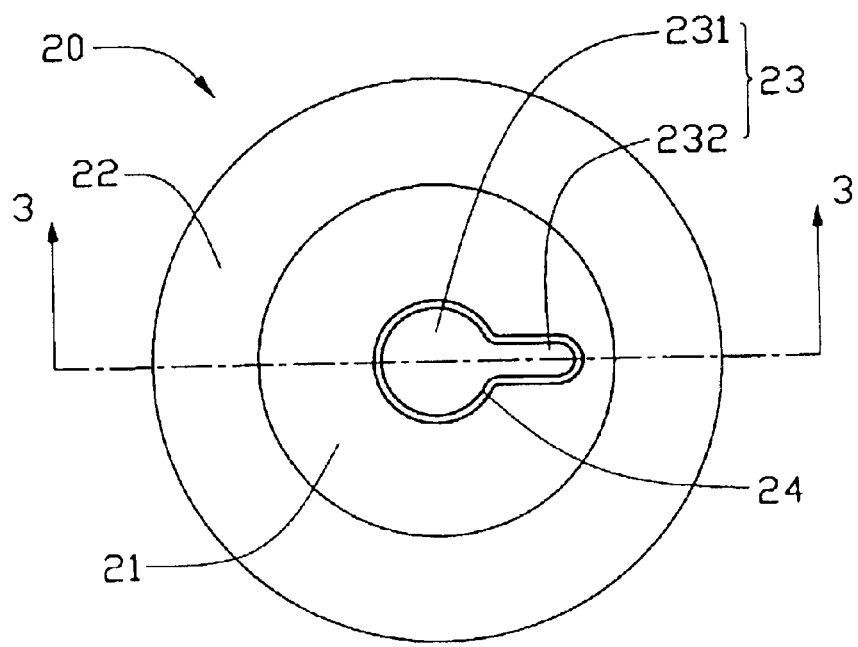
FIG. 2 is a top view of the housing of the semiconductor package shown in FIG. 1.
Figure 3:
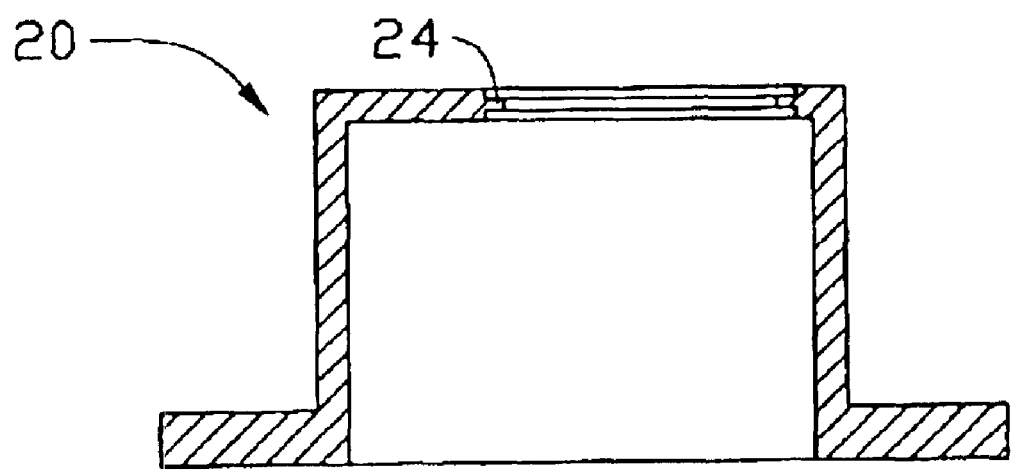
FIG. 3 is a cross-sectional view of the housing of FIG. 2 taken along line 3—3.

Referring now to FIG. 2 and FIG. 3, a continuous projection 24 is formed on an inner periphery of the top portion 21, the projection 24 projecting into the optical cavity 23. The projection 24 projects continuously into the window 231 and into the sprue 232 to form a continuous, closed structure. A plurality of discrete projections can take the place of the projection 24.

Figure 4:
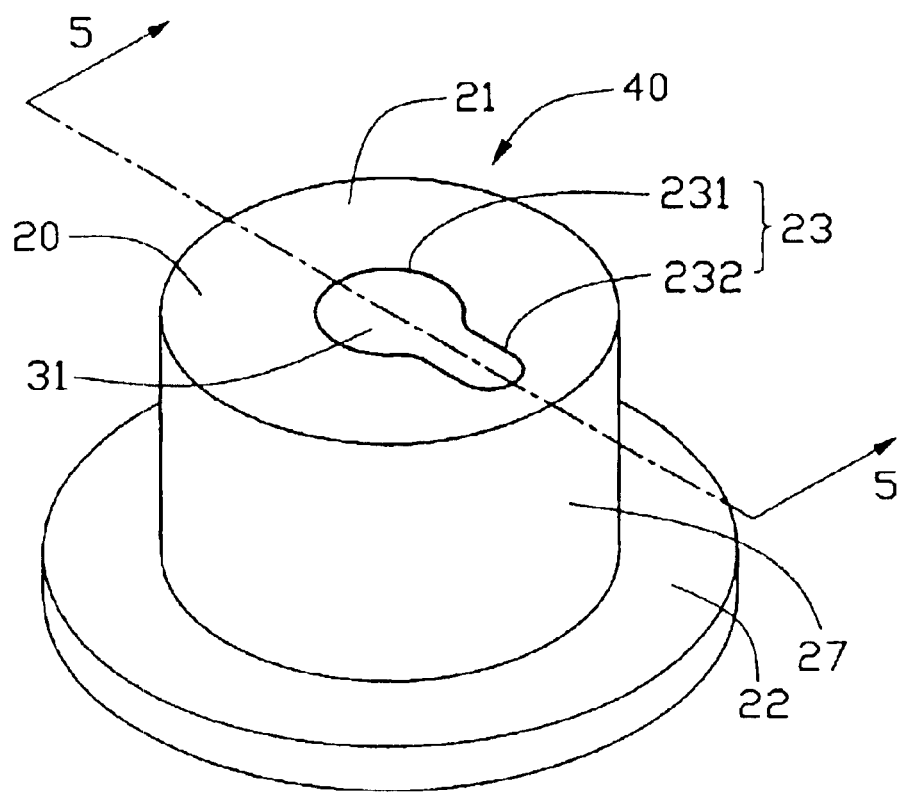
FIG. 4 is a perspective view of a semiconductor package made by the method of the present invention with an integrated optical element in a top portion of the housing.
Figure 5:
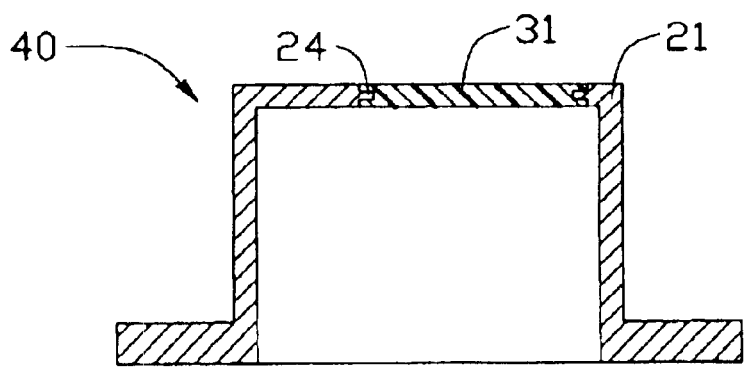
FIG. 5 is a cross-sectional view of the package of FIG. 4 taken along line 5—5.

Referring to FIG. 4 and FIG. 5, an optical element 31 of the package 40 is positioned in the optical cavity 23 of the housing 20 to form the window 231 that permits passage of laser emissions therethrough. The optical element 31 is integrated with the housing 20 via the projection 24. The optical element 31 is made of a transparent plastic material. The thickness of the optical element 31 is equal to that of the top portion 21 to attain an optimal optical result.

A method of manufacturing the package 40 according to the present invention comprises the following steps of: (1)

providing the housing 20 with the top portion 21, the top portion 21 defining the optical cavity 23 comprising the window 231 and the sprue 232; (2) disposing the housing 20 in a cavity of a mold (not shown); (3) closing the mold and injecting a melted transparent plastic resin into the sprue 232 to fill the sprue 232 and the window 231 to form the integrated optical element 31; and (4) taking the package 40 out of the mold (not shown) after curing of the injected plastic resin.

Figure 6:
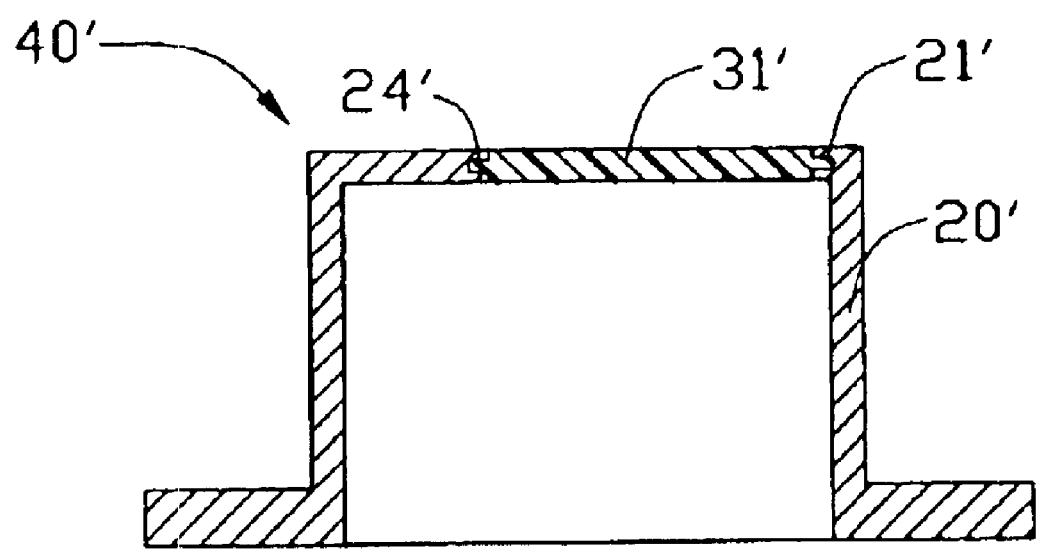
FIG. 6 is a cross-sectional view of a package made according to another preferred embodiment of the present invention.
Figure 7:
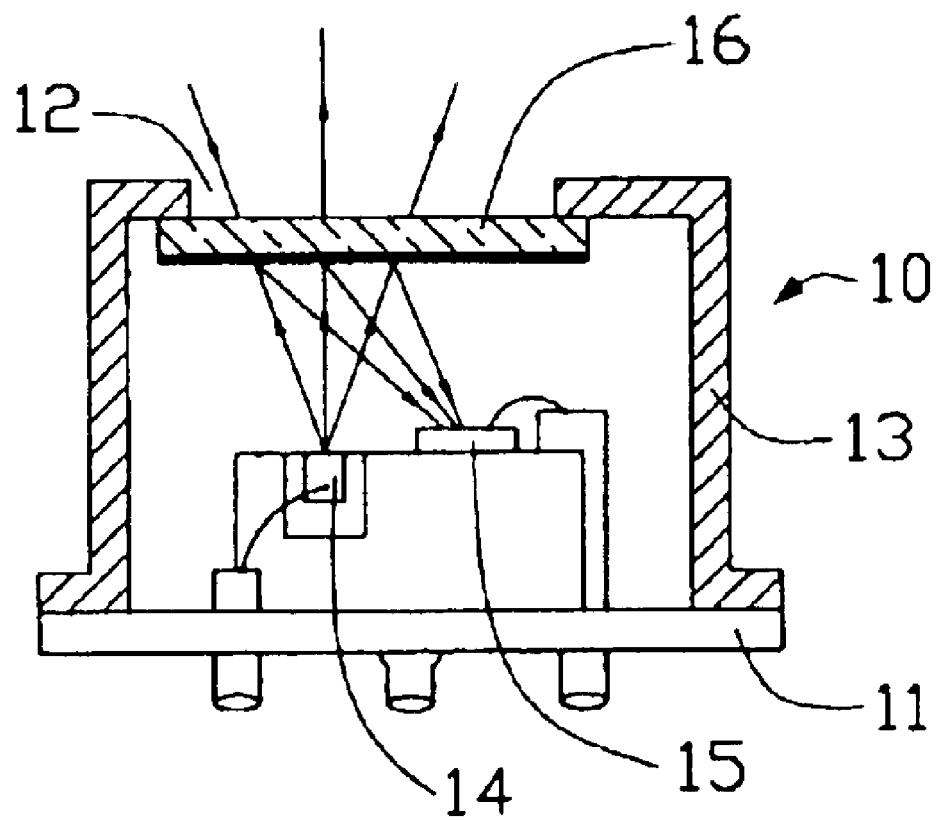
FIG. 7 is a schematic cross-sectional view of a conventional semiconductor laser package.

FIG. 6 is a cross-sectional view of a semiconductor laser package 40' made in accordance with a method of another preferred embodiment of the present invention. A continuous slot 24' is defined along an inner periphery of a top portion 21' of a housing 20' of the package 40', the slot 24' being in communication with an optical cavity (not labeled). The slot 24 is defined in the top portion 21' to anchor an injection molded optical element 31' in the optical cavity (not labeled) defined in the top portion 21'. A plurality of discrete slots can take the place of the slot 24'. A4

A package made using a method in accordance with the present invention can also be used to encapsulate a photo detector, an optical transceiver module, or other optical elements. A package made according to a method of the present invention has many advantages. The optical element is integrated with the top portion of the housing using insert molding; therefore, the package has a strong structure and is not as easily damaged when subjected to impact. Additionally, manufacturing the optical element of the present invention using injection molding can achieve an optimal optical result without extra processing of the optical element, so labor used during assembly is reduced, and the manufacturing of the package is faster. Manufacture using injection molding also promotes ease of large scale production. Moreover, the optical element is made of a plastic material, which is comparatively inexpensive, therefore, the manufacturing cost is further reduced.

It is believed that the present invention and its advantages will be understood from the foregoing description and it will be apparent that various changes may be made thereto without departing from the spirit and scope of the invention or sacrificing all of its material advantages, the examples hereinbefore described merely being preferred or exemplary embodiments of the invention.

I claim:

1. A method of manufacturing a semiconductor laser package, comprising the steps of:
   (1) providing a housing with a top portion, an optical cavity being defined in the top portion, the optical cavity comprising a window and a sprue in communication with each other;
   (2) disposing the housing in a cavity of a mold;
   (3) closing the mold and injecting a melted transparent plastic resin into the sprue to fill the sprue and the window, thereby forming an integrated optical element; and
   (4) taking the housing out of the mold after curing of the injected plastic resin.

2. The method of claim 1, wherein a continuous projection is formed along an inner periphery of the top portion, projecting into the optical cavity, the continuous projection engaging with the optical element during insert molding.

3. The method of claim 1, wherein a plurality of projections are formed along an inner periphery of the top portion and project into the optical cavity, the projections engaging with the optical element during insert molding.

4. The method of claim 1, wherein a continuous slot is defined in an inner periphery of the top portion for anchoring an optical element in the optical cavity, the continuous slot receiving the optical element during insert molding.

5. The method of claim 1, wherein a plurality of slots are defined in an inner periphery of the top portion and are in communication with the optical cavity for anchoring an optical element in the optical cavity, the slots receiving the optical element during insert molding.

6. The method of claim 1, wherein the housing is made of metal by way of stamping.

7. The method of claim 1, wherein the housing is made of plastic by way of press molding.

8. A method of making a semiconductor laser package, comprising the steps of:
   (1) providing a housing with a top portion, a cavity defined in said top portion and including a large window and a small sprue communicating with said window;
   (2) insert molding said housing to have the cavity filled with a melted plastic resin via said sprue; and
   (3) solidifying the melted plastic resin and keeping the solidified plastic resin flush with two opposite surfaces of the top portion.

9. The method of claim 8, further including the step of providing means for interlocking the solidified plastic resin and the top portion together without up and down movement therebetween.

10. The method of claim 8, wherein said window is dimensioned to be large enough for reflecting dispersing light emitted from a laser thereunder.

* * * * *